(12) United States Patent
Vanderhaegen et al.

(10) Patent No.: US 9,252,355 B2
(45) Date of Patent: Feb. 2, 2016

(54) LOW OFFSET AND HIGH SENSITIVITY VERTICAL HALL EFFECT SENSOR

(71) Applicant: Robert Bosch GmbH, Stuttgart (DE)

(72) Inventors: Johan Vanderhaegen, Cupertino, CA (US); Chinwuba Ezekwe, Albany, CA (US); Xinyu Xing, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/478,317

(22) Filed: Sep. 5, 2014

(65) Prior Publication Data

US 2015/0069563 A1 Mar. 12, 2015

Related U.S. Application Data

(60) Provisional application No. 61/874,385, filed on Sep. 6, 2013.

(51) Int. Cl.
| | |
|---|---|
| H01L 27/22 | (2006.01) |
| H01L 43/06 | (2006.01) |
| G01R 33/07 | (2006.01) |
| G01R 33/00 | (2006.01) |

(52) U.S. Cl.
CPC .......... *H01L 43/065* (2013.01); *G01R 33/0052* (2013.01); *G01R 33/075* (2013.01); *G01R 33/077* (2013.01)

(58) Field of Classification Search
CPC .... G01R 33/077; G01R 33/07; G01R 33/075; G01R 33/072; G01R 33/0029; G01R 33/0082; G01R 33/066; G01R 33/0052; G01R 33/091; G01R 33/0023; G01R 33/022; G01R 15/202; G01R 15/20; H01L 43/065; H01L 43/14; H01L 43/06; H01L 43/04; H01L 27/22

USPC .......... 324/251, 207.2, 117 H, 225, 244, 200, 324/207.13, 207.21, 207.23, 239, 249, 252, 324/260, 529; 257/427, 421, 425, E47.002, 257/E47.005, E21.135, E21.211, E27.005, 257/E27.062, E43.003, 369, 414, 424; 438/3, 199, 510; 327/511, 564; 360/112
See application file for complete search history.

(56) References Cited

U.S. PATENT DOCUMENTS

| | | | |
|---|---|---|---|
| 7,872,322 B2 | 1/2011 | Schott et al. | |
| 8,164,149 B2 | 4/2012 | Schott | |
| 2011/0260723 A1 | 10/2011 | Han | |
| 2012/0153945 A1 | 6/2012 | Ezekwe | |
| 2013/0015847 A1 | 1/2013 | Kaufmann et al. | |
| 2013/0021027 A1* | 1/2013 | Ausserlechner | G01R 33/075 324/251 |
| 2013/0069640 A1 | 3/2013 | Ausserlechner | |

OTHER PUBLICATIONS

International Search Report and Written Opinion corresponding to PCT Application No. PCT/US2014/054300, mailed Dec. 12, 2014 (10 pages).

* cited by examiner

*Primary Examiner* — Julio J Maldonado
*Assistant Examiner* — Cory Eskridge
(74) *Attorney, Agent, or Firm* — Maginot Moore & Beck LLP

(57) ABSTRACT

A vertical Hall Effect sensor is provided having a high degree of symmetry between its bias modes, can be adapted to exhibit a small pre-spinning systematic offset, and complies with the minimal spacing requirements allowed by the manufacturing technology (e.g., CMOS) between the inner contacts. These characteristics enable the vertical Hall Effect sensor to have optimal performance with regard to offset and sensitivity.

19 Claims, 2 Drawing Sheets

LOW OFFSET AND HIGH SENSITIVITY VERTICAL HALL EFFECT SENSOR

CROSS-REFERENCE TO RELATED APPLICATIONS

This application claims priority to U.S. Provisional Application Ser. No. 61/874,385 entitled "LOW OFFSET AND HIGH SENSITIVITY VERTICAL HALL EFFECT SENSOR" by Vanderhagen et al., filed Sep. 6, 2013 the disclosure of which is hereby incorporated herein by reference in its entirety.

TECHNICAL FIELD

The disclosure relates to magnetic field sensors and more specifically to semiconductor Hall Effect Sensors which detect magnetic fields parallel to the chip surface, also referred to as Vertical Hall Effect Sensors.

BACKGROUND

Hall Effect devices are used in sensor applications for contactless sensing of magnetic fields. Hall Effect sensors are capable of being implemented on semiconductor chips using CMOS technology. This has resulted in Hall Effect sensors being one of the most widely used types of magnetic sensors. Standard CMOS Hall devices, however, are typically only capable of detecting magnetic fields that are perpendicular to the surface of the semiconductor chip.

Various methods have been developed to detect magnetic fields that are parallel to the surface of a semiconductor chip. One method uses magnetic concentrators to "steer" magnetic fields toward the surface of the chip so that they can be detected using standard Hall Effect sensors. The magnetic concentrators, however, add cost to and increase the complexity of manufacturing the device.

Another method that has been developed for detecting magnetic fields parallel to the chip surface is the use of so-called vertical Hall Effect devices. Vertical Hall Effect devices include a plurality of contacts in a well arranged in a straight line parallel to the surface of the chip. Two of the contacts are connected to a bias current or voltage to introduce a current path through the chip. The output voltage is used to measure the output voltage of the Hall device. In the presence of a magnetic field, the carriers that are moving along the path are deflected by a Lorentz force and a Hall electric field is formed.

One difficulty faced in the use of vertical Hall Effect sensors, however, is the voltage offset that is typically introduced into the output voltage of the sensor due to various factors, such as fabrication imperfections and environmental conditions. The presence of the voltage offset in the sensor output compromises the accuracy of the magnetic field measurement obtained by the Hall device.

To compensate for voltage offset in Hall Effect devices, a spinning current technique has been developed for the sensor in which the contacts of the Hall device that are used to connect the bias source and the contacts used to connect provide the output voltage are switched to provide a plurality of bias modes. Each bias mode can provide a slightly different output voltage. As a result, the output voltage is modulated which enables the offset voltage, which appears as a DC component of the signal, to be identified and compensated for in the measurement of the magnetic field.

The spinning current method requires a highly symmetric device to be effective. Vertical Hall Effect devices, however, are geometrically asymmetric due to the linear arrangement of the contacts. Therefore, one of the most difficult tasks in the development of vertical Hall Effect sensors is determining an arrangement or connection configuration for the contacts of a vertical Hall device that enables a symmetric response so that the spinning current method can be used to cancel the offset.

One example of a previously known vertical Hall Effect device includes a linear arrangement of four contacts. The four-contact vertical Hall Effect device is capable of providing a high degree of symmetry between bias modes which allows the spinning current technique to be used to cancel the offset. However, the four contact device exhibits a large pre-spinning systematic offset which, besides presenting a significant dynamic range challenge to the readout electronics, results in the feed through of the noise in the Hall sensor bias circuitry to the final output, which degrades the signal to noise ratio.

To reduce the pre-spinning offset voltage, vertical Hall devices have been provided with five or even six contacts in a linear arrangement. The five-contact vertical Hall Effect device is highly asymmetric between bias modes which results in the ineffectiveness of the spinning current technique to cancel offset.

In a previously known six-contact vertical Hall Effect device, the outer contacts are shorted together and the inner contacts are used as a four-contact Hall device. The six-contact sensor has a high degree of symmetry between it bias modes, and can be adapted to exhibit a small pre-spinning systematic offset. However, the spacing required to achieve a nominally zero offset and maximum sensitivity for the sensor require deeper wells to allow adequate spacing between contacts. As a result, the sensor size may be too big or too inconvenient to implement in some devices.

DETAILED DESCRIPTION

Figure 1:
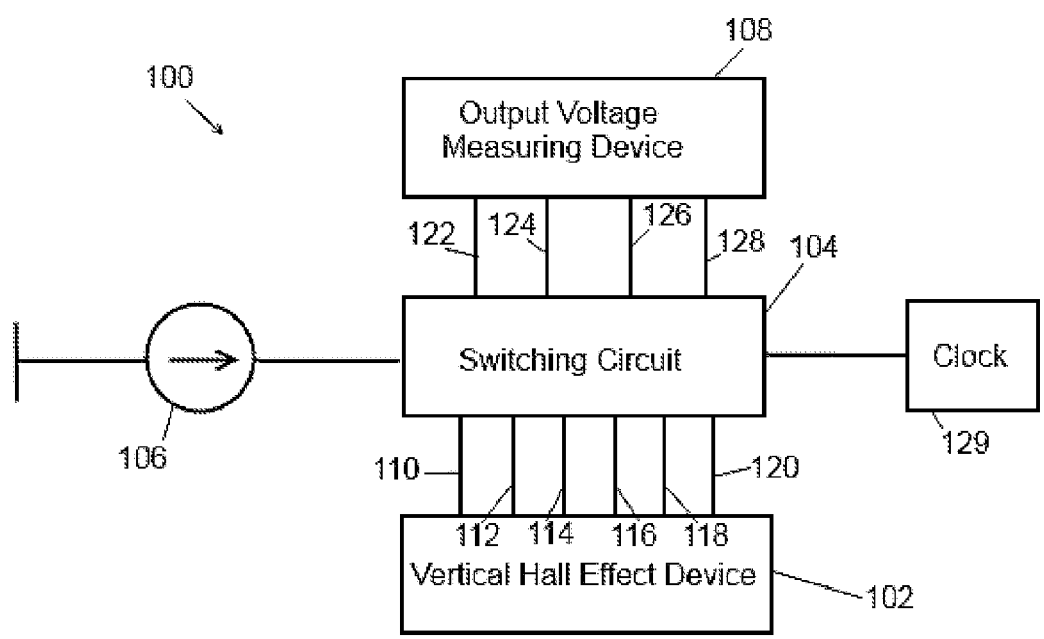
FIG. 1 is a schematic view of a vertical Hall Effect sensor circuit including a vertical Hall Effect device in accordance with the disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one of ordinary skill in the art to which this disclosure pertains.

This disclosure is directed to a vertical Hall Effect sensor which has a high degree of symmetry between its bias modes, can be adapted to exhibit a small pre-spinning systematic offset, and complies with the minimal spacing requirements allowed by the manufacturing technology (e.g., CMOS) between the inner contacts. These characteristics enable the vertical Hall Effect sensor to have optimal performance with regard to offset and sensitivity.

According to one embodiment of the disclosure a vertical Hall Effect sensor comprises a Hall Effect device including a substrate having a top surface and a region below the top surface of a first conductivity type. A conductive well is embedded in the region that has a second conductivity type. A first, second, third, fourth, fifth, sixth, seventh, and eighth ohmic contact are arranged sequentially and spaced apart from each other in a row within the conductive well that is generally parallel to the top surface of the substrate. Each of the first, second, third, fourth, fifth, sixth, seventh, and eight ohmic contacts has a conductivity that is different than the conductivity of the well.

The Hall Effect device further includes a voltage measuring device having four input terminals, and a switching device configured to be connected to a bias source. The voltage measuring device is configured to process a voltage received across the four input terminals of the voltage measuring device to determine Hall voltage that corresponds to a measurement of a magnetic field. The switching device has a four output terminals which are electrically connected to the four input terminals, respectively, of the switching device and a first, second, third, fourth, fifth, and sixth input terminal.

The first and the sixth ohmic contact are electrically connected to each other and to the fifth input terminal of the switching device. The third and eighth ohmic contact are electrically connected to each other and to the second input terminal of the switching device. The second ohmic contact is electrically connected to the first input terminal of the switching device. The fourth ohmic contact is electrically connected to the third input terminal of the switching device. The fifth ohmic contact is electrically connected to the fourth input terminal of the switching device, and the seventh ohmic contact is electrically connected to the sixth input terminal of the switching device. The first and the sixth ohmic contact and the third and the eighth ohmic contact may be electrically connected via metallizations.

The switching device includes a plurality of modes of operation. In each of the modes of operation, the switching device is configured to electrically connect two input terminals selected from the first, second, third, fourth, fifth, and sixth input terminals of the switching device to the bias source and to ground, respectively, and to electrically connect the remaining four input terminals of the switching device not connected to the bias source and to ground to the four input terminals of the voltage measuring device via the four output terminals, respectively, of the switching device.

In one embodiment, the switching device includes a mode of operation in which the two input terminals electrically connected to the bias source and to ground, respectively, comprises an alternating pair of input terminals selected from the second, third, fourth, and fifth input terminals of the switching device, and the remaining four input terminals connected to the four output terminals of the switching device include the first and sixth input terminals and the remaining two input terminals of the second, third, fourth, and fifth input terminals not connected to the bias source or to ground to the four.

In one embodiment, the first ohmic contact is spaced apart from the second ohmic contact and the eighth ohmic contact is spaced apart from the seventh ohmic contact by a first distance. The second ohmic contact is spaced apart from the third ohmic contact, the third ohmic contact is spaced apart from the fourth ohmic contact, the fourth ohmic contact is spaced apart from the fifth ohmic contact, the fifth ohmic contact is spaced apart from the sixth ohmic contact, and the sixth ohmic contact is spaced apart from the seventh ohmic contact by a second distance with the first distance being greater than the second distance. In one particular embodiment, the second distance is approximately half the first distance.

In one embodiment, the conductive well comprises an N-type conductivity and the region comprises a P-type conductivity. In this embodiment, the first, second, third, fourth, fifth, sixth, seventh, and eighth ohmic contact may comprise a more highly doped N-type conductivity than the N-type conductivity of the conductive well.

In another embodiment, a method of fabricating a Hall Effect device comprises forming a first, second, third, fourth, fifth, sixth, seventh, and eighth ohmic contact sequentially and spaced apart from each other in a row within a conductive well in a region of a substrate, the conductive well being of a first conductivity type and the region being of a second conductivity type, the row being generally parallel to an upper surface of the substrate, each of the first, second, third, fourth, fifth, sixth, seventh, and eight ohmic contacts having a conductivity that is different than the conductivity of the well. The first and the sixth ohmic contact are electrically connected to each other and the third and the eighth contact are electrically connected to each other. The ohmic contacts are arranged such that the first ohmic contact is spaced apart from the second ohmic contact and the eighth ohmic contact is spaced apart from the seventh ohmic contact by a first distance; and the second ohmic contact is spaced apart from the third ohmic contact, the third ohmic contact is spaced apart from the fourth ohmic contact, the fourth ohmic contact is spaced apart from the fifth ohmic contact, the fifth ohmic contact is spaced apart from the sixth ohmic contact, and the sixth ohmic contact is spaced apart from the seventh ohmic contact by a second distance that is less than the first distance, e.g., one half the first distance.

Referring now to FIG. 1, a vertical Hall Effect sensor 100 in accordance with the disclosure includes a vertical Hall Effect device 102, a switching circuit 104, a bias source 106, and an output voltage measuring device 108. The vertical Hall Effect device 102 has input/output terminals 110, 112, 114, 116, 18, 120 and the output voltage measuring device 108 has four input terminals 122, 124, 126, 128. The switching circuit 104 has four sensor connections that are connected to the connection terminals 110, 112, 114, 116, 118, 120 of the Hall device 102, and four output voltage connections connected to the input terminals 122, 124, 126, 128 of the measuring device 108. The switching circuit also includes an input connected to the bias source 106, which may be a current source or a voltage source.

As discussed below, the vertical Hall Effect device includes a plurality of predefined bias modes. Each bias mode defines which terminals are to be used as inputs for introducing current into the Hall device and which terminals are to be used as outputs across which the magnetic field dependent output voltage is to be measured. The switching circuit 104 is configured to operably couple the terminals 110, 112, 114, 116, 118, 120 of the Hall device 102 to the bias source 106 and to the output voltage measuring device 108 in accordance with each of the bias modes of the Hall device 102 and to sequentially switch the connections to each bias mode to implement a spinning current scheme.

In each bias mode, the switching device 104 couples one of the terminals 110, 112, 114, 116, 118, 120 to the bias source, another of the terminals 110, 112, 114, 116, 118, 120 to a ground potential, and the four remaining of the terminals 110, 112, 114, 116, 118, 120 to the respective input terminals 122, 124, 126, 128 of the output voltage measuring device 108. The switching circuit 104 is configured to switch the Hall device 102 between bias modes based on a clock signal received, for example, from a clock generator 129.

The input terminals of the Hall device 102 define a current path into and out of the device 102 in each bias mode. In the presence of a magnetic field with a component that is parallel to an upper surface of the vertical Hall device 102, the carriers that are moving along the path are deflected by the Lorentz force, and a Hall electrical field is formed. The Hall electric field influences the output voltage that appears across the output terminals of the Hall device 102 and is coupled to the input terminals 122, 124, 126, 128 of the measuring device 108. The measuring device 108 is configured to process the voltage received across the input terminals 122, 124, 126, 128 to determine a Hall voltage that corresponds to a measure of the magnetic field.

The Hall device 102, switching device 104, and measuring device 108 may be implemented on a single chip or multiple chips, and may include various circuit components and elements, such as amplifiers, analog-to-digital converters, memory, logic, etc., that may be needed to perform the functions described herein as well as other functions that would be known to a person of ordinary skill in the art.

Figure 2:
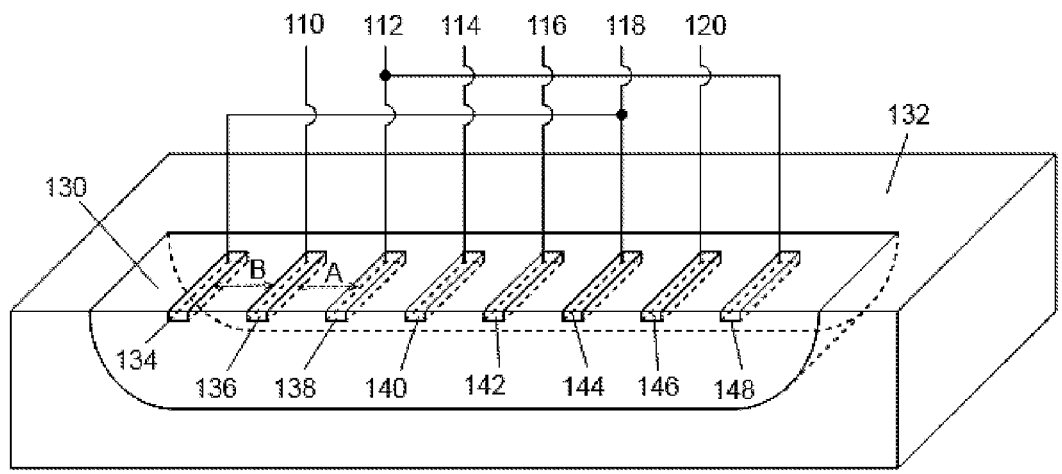
FIG. 2 is a schematic view of an embodiment of the vertical Hall Effect device of FIG. 1.

Referring now to FIG. 2, an embodiment of a vertical Hall Effect device 102 of the sensor 100 is depicted in greater detail. The vertical Hall Effect device 102 is formed using CMOS technology and comprises an electrically conductive well 130 of a first conductivity type embedded in a substrate 132 or region of a substrate of a second conductivity type. For example, in one embodiment, the vertical Hall Effect sensor 102 comprises an N-type well embedded in a P-type substrate. In another embodiment, the vertical Hall Effect sensor comprises a P-type well embedded in an N-type substrate. In one embodiment, the well 130 and substrate 132 are doped to provide the first and second conductivity types although the conductivities may be provided by the well and the substrate in any suitable manner.

The Hall device 102 includes eight ohmic contacts 134, 136, 138, 140, 142, 144, 146, 148 that are arrayed in a straight line in the well 130 generally parallel to the upper surface of the well 130 and substrate 132 to implement a vertical Hall Effect device. The contacts 134, 136, 138, 140, 142, 144, 146, 148 are exposed at the upper surface of the well 130 where they are connected to the wiring terminals 110, 112, 114, 116, 118, 120. In one embodiment, the ohmic contacts 134, 136, 138, 140, 142, 144, 146, 148 are provided as more highly doped regions of the first conductivity type within the well (e.g., N+ doping in N-type well or P+ doping in P-type well).

The ohmic contacts include two outer contacts 134, 148, i.e., the first and the eighth contact, which are arranged at each end of the line of contacts, and six inner contacts 136, 138, 140, 142, 144, 146, i.e., the second through seventh contacts, which are arranged between the two outer contacts 134, 148. Each of the contacts is spaced apart from the adjacent contacts in the line by a predetermined distance. The first contact (outer contact 134) is electrically connected to the sixth contact (inner contact 144), and the eighth contact (outer contact 148) is electrically connected to the third contact (inner contact 138). The first and sixth contacts and the third and eighth contacts may be electrically connected, for example, through metallization or other means available in the semiconductor technology.

The dimensions of the contacts as well as the spacings between contacts are dependent at least partly on the desired sensor characteristics and the limits allowed by the semiconductor fabrication technology. For example, in the embodiment of FIG. 2, the contacts may be provided with a minimal length and the minimal spacing allowed by the manufacturing process although not necessarily. In the embodiment of FIG. 2, the inner contacts 136, 138, 140, 142, 144, 146 are each spaced apart from each other by a distance A. The outer contacts 134, 148 are each spaced apart from the adjacent inner contacts 136, 146 by a distance B. In one embodiment, the spacing B for the outer contacts 134, 148 is greater than the spacing A provided between the inner contacts 136, 138, 140, 142, 144, 146. This helps to reduce the voltage offset and the pre-spinning offset of the device 102. The spacing B may be selected to enable a nominally zero offset in each of the bias modes of the sensor. For example, in one particular embodiment, the spacing B is selected to be twice the spacing A provided between the inner contacts.

The contacts 134, 136, 138, 140, 142, 144, 146, 148 are connected as depicted in FIG. 2 to the six terminals 110, 112, 114, 116, 118, 120. In the embodiment of FIG. 2, the second contact 136 is connected to terminal 110; the connected third and eighth contact pair 138, 148 is connected to the terminal 112; the fourth contact 140 is connected to terminal 114; the fifth contact 142 is connected to the terminal 116; the connected sixth and first contact pair 144, 134 is connected to the terminal 118; and the seventh contact 146 is connected to terminal 120. By interconnecting the contacts as described herein, a vertical Hall Effect device is provided with a high degree of symmetry between bias modes and with minimum spacing between contacts. This symmetry enables a spinning current technique to be used to reduce or eliminate the offset of the Hall Effect device 102.

To implement a spinning current scheme, the Hall device 102 has a plurality of bias modes that define which contacts are connected to the bias source 106 and the measuring device 108. In one mode of operation, an alternating pair of the inner terminals 112, 114, 116, and 118 is connected to the bias source and to ground to introduce the current into the well and the remaining terminals are connected to the inputs of the measuring device 108 to measure the Hall voltage. In this embodiment, two bias modes are provided. In a first bias mode, terminals 112, 116 are connected to the bias source 106 and to ground to provide the current path into the well and the remaining terminals 110, 114, 118, 120 are connected to the measuring device to measure the Hall voltage. In a second bias mode, terminals 114, 118 are connected to the bias source 106 and to ground to provide the current path into the well and the remaining terminals 110, 112, 116, 120 are connected to the measuring device to measure the Hall voltage.

In this mode of operation, the second contact 136 and the seventh contact 146 serve the purpose of more accurately defining the resistance between the first contact 134 and the third contact 138 at one end of the device and between the sixth contact 144 and the eighth contact 148, respectively. If one only considers the resistance between neighboring contacts, then the resistance between the first contact 134 and the third contact 138 will be exactly twice the resistance between the third contact 138 and the fourth contact 140, and the resistance between the eighth contact 148 and the sixth contact 144 with be exactly twice the resistance between the sixth contact 144 and the fifth contact 142. Because the contacts 136, 146 enable such a resistance ratio (i.e., 2), the terminals 112, 114, 116, 118 will see a Hall sensor with a balanced bridge and thus no built-in offset.

The Hall device 102 includes another mode of operation in which the outer terminals 110, 120 are used to provide the output voltage to the measuring device 108. In this embodiment, the measuring device includes two input terminals. The offset is determined based on the current crowding due to finite distance to the edge of the well. The voltage difference between the nominally equal terminals 110, 120 can then be used to compensate the offset electronically. In this embodiment, the inner terminals 112, 114, 116, 118 are used as described above by driving the terminal pair 112, 116 and the terminal pair 114, 118 in an alternating sequence.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A vertical Hall Effect sensor comprising:
a Hall Effect device including:
a substrate having a top surface and a region below the top surface of a first conductivity type;
a conductive well embedded in the region and having a second conductivity type;
a first, second, third, fourth, fifth, sixth, seventh, and eighth ohmic contact arranged sequentially and spaced apart from each other in a row within the conductive well, the row being generally parallel to the top surface, each of the first, second, third, fourth, fifth, sixth, seventh, and eight ohmic contacts having a conductivity that is different than the conductivity of the well;
a voltage measuring device including four input terminals;
a switching device configured to be connected to a bias source and including:
four output terminals which are electrically connected to the four input terminals, respectively, of the switching device; and
a first, second, third, fourth, fifth, and sixth input terminal;
wherein the first and the sixth ohmic contacts are electrically connected to each other and to the fifth input terminal of the switching device,
wherein the third and the eighth ohmic contacts are electrically connected to each other and to the second input terminal of the switching device, wherein the second ohmic contact is electrically connected to the first input terminal of the switching device, wherein the fourth ohmic contact is electrically connected to the third input terminal of the switching device, wherein the fifth ohmic contact is electrically connected to the fourth input terminal of the switching device, wherein the seventh ohmic contact is electrically connected to the sixth input terminal of the switching device, wherein the switching device includes a plurality of modes of operation, and
wherein in each of the modes of operation, the switching device is configured to electrically connect two of the input terminals selected from the first, second, third, fourth, fifth, and sixth input terminals of the switching device to the bias source and to ground, respectively, and to electrically connect the remaining four input terminals of the switching device not connected to the bias source and to ground to the four input terminals of the voltage measuring device via the four output terminals, respectively, of the switching device.

2. The vertical Hall Effect sensor of claim 1, wherein the switching device includes a mode of operation in which the two input terminals electrically connected to the bias source and to ground, respectively, comprises an alternating pair of input terminals selected from the second, third, fourth, and fifth input terminals of the switching device, and
the remaining four input terminals connected to the four output terminals of the switching device include the first and sixth input terminals and the remaining two input terminals of the second, third, fourth, and fifth input terminals not connected to the bias source or to ground.

3. The vertical Hall effect sensor of claim 1, wherein the first ohmic contact is spaced apart from the second ohmic contact and the eighth ohmic contact is spaced apart from the seventh ohmic contact by a first distance,
wherein the second ohmic contact is spaced apart from the third ohmic contact, the third ohmic contact is spaced apart from the fourth ohmic contact, the fourth ohmic contact is spaced apart from the fifth ohmic contact, the fifth ohmic contact is spaced apart from the sixth ohmic contact, and the sixth ohmic contact is spaced apart from the seventh ohmic contact by a second distance, and
wherein the first distance is greater than the second distance.

4. The vertical Hall Effect sensor of claim 3, wherein the second distance is approximately half the first distance.

5. The vertical Hall Effect sensor of claim 3, wherein the conductive well comprises an N-type conductivity and the region comprises a P-type conductivity.

6. The vertical Hall Effect sensor of claim 5, wherein the first, second, third, fourth, fifth, sixth, seventh, and eighth ohmic contacts comprise a more highly doped N-type conductivity than the N-type conductivity of the conductive well.

7. The vertical Hall Effect sensor of claim 1, wherein the first and the sixth ohmic contacts and the third and the eighth ohmic contacts are electrically connected via metallizations.

8. The vertical Hall Effect sensor of claim 3, wherein the voltage measuring device is configured to process a voltage received across the four input terminals of the voltage measuring device to determine Hall voltage that corresponds to a measurement of a magnetic field.

9. A Hall Effect device comprising:
a substrate having a top surface and a region below the top surface of a first conductivity type;
a conductive well embedded in the region and having a second conductivity type;
a first, second, third, fourth, fifth, sixth, seventh, and eighth ohmic contact arranged sequentially and spaced apart from each other in a row within the conductive well, the row being generally parallel to the top surface, each of the first, second, third, fourth, fifth, sixth, seventh, and eight ohmic contacts having a conductivity that is different than the conductivity of the well;
wherein the first and the sixth ohmic contacts are electrically connected to each other and the third and the eighth ohmic contacts are electrically connected to each other.

10. The Hall Effect device of claim 9, wherein the first ohmic contact is spaced apart from the second ohmic contact and the eighth ohmic contact is spaced apart from the seventh ohmic contact by a first distance,
wherein the second ohmic contact is spaced apart from the third ohmic contact, the third ohmic contact is spaced apart from the fourth ohmic contact, the fourth ohmic contact is spaced apart from the fifth ohmic contact, the fifth ohmic contact is spaced apart from the sixth ohmic contact, and the sixth ohmic contact is spaced apart from the seventh ohmic contact by a second distance, and
wherein the first distance is greater than the second distance.

11. The Hall Effect device of claim 10, wherein the second distance is approximately half the first distance.

12. The Hall Effect device of claim 10, wherein the conductive well comprises an N-type conductivity and the region comprises a P-type conductivity.

13. The vertical Hall Effect device of claim 12, wherein the first, second, third, fourth, fifth, sixth, seventh, and eighth ohmic contacts comprise a more highly doped N-type conductivity than the N-type conductivity of the conductive well.

14. The vertical Hall Effect sensor of claim 9, wherein the first and the sixth ohmic contacts and the third and the eighth ohmic contacts are electrically connected via metallizations.

15. A method of fabricating a Hall Effect device, the method comprising:

forming a first, second, third, fourth, fifth, sixth, seventh, and eighth ohmic contact sequentially and spaced apart from each other in a row within a conductive well in a region of a substrate, the conductive well being of a first conductivity type and the region being of a second conductivity type, the row being generally parallel to an upper surface of the substrate, each of the first, second, third, fourth, fifth, sixth, seventh, and eight ohmic contacts having a conductivity that is different than the conductivity of the well; and electrically connecting the first and the sixth ohmic contacts to each other and the third and the eighth contacts to each other, wherein the first ohmic contact is spaced apart from the second ohmic contact and the eighth ohmic contact is spaced apart from the seventh ohmic contact by a first distance, wherein the second ohmic contact is spaced apart from the third ohmic contact, the third ohmic contact is spaced apart from the fourth ohmic contact, the fourth ohmic contact is spaced apart from the fifth ohmic contact, the fifth ohmic contact is spaced apart from the sixth ohmic contact, and the sixth ohmic contact is spaced apart from the seventh ohmic contact by a second distance, and wherein the first distance is greater than the second distance.

16. The method of claim 15, wherein the second distance is approximately half the first distance.

17. The method of claim 15, wherein the conductive well comprises an N-type conductivity and the region comprises a P-type conductivity.

18. The method of claim 17, wherein the first, second, third, fourth, fifth, sixth, seventh, and eighth ohmic contacts comprise a more highly doped N-type conductivity than the N-type conductivity of the conductive well.

19. The method of claim 15, wherein the first and the sixth ohmic contacts and the third and the eighth ohmic contacts are electrically connected via metallizations.

\* \* \* \* \*